United States Patent
Baeg et al.

[19]

[11] Patent Number: 6,019,502
[45] Date of Patent: Feb. 1, 2000

[54] TEST CIRCUITS AND METHODS FOR BUILT-IN TESTING INTEGRATED DEVICES

[75] Inventors: Sang-Hyeon Baeg, Kyungki-do; Seong-Won Lee, Seoul, both of Rep. of Korea

[73] Assignee: Samsung Electronics Co., Ltd., Kyungki-do, Rep. of Korea

[21] Appl. No.: 08/717,695

[22] Filed: Sep. 23, 1996

[30] Foreign Application Priority Data

Sep. 29, 1995 [KR] Rep. of Korea ........................ 95-32710

[51] Int. Cl.[7] ....................................................... G06F 11/60
[52] U.S. Cl. ............................................................ 371/21.1
[58] Field of Search .................................. 371/21.1, 21.2, 371/21.5; 395/183.06, 183.09, 183.12

[56] References Cited

U.S. PATENT DOCUMENTS 5,542,033  7/1996  Dao-Trong et al. ............... 395/183.04
5,617,531  4/1997  Crouch et al. ..................... 395/183.02

*Primary Examiner*—Vincent P. Canney
*Attorney, Agent, or Firm*—Myers Bigel Sibley & Sajovec, L.L.P.

[57] ABSTRACT

An test circuit and method for testing an integrated device having an embedded function and a built-in test circuit for testing the embedded function. The built-in test circuit provides control signals to the embedded function based upon an internal state of the built-in test circuit. The integrated device is tested by comparing the control signals provided to the embedded function to the desired control signals based upon the internal state of the built-in self test circuit to confirm the proper operation of the built-in self test circuit. The internal state of the built-in test circuit is monitored and the control signals provided to the embedded function are monitored. The monitored signals are compared to an expected signal pattern based upon the monitored internal state of the built-in test circuit. An error signal is generated if the comparison determines that the monitored control signals do not correspond to the expected signal pattern.

15 Claims, 2 Drawing Sheets

TEST CIRCUITS AND METHODS FOR BUILT-IN TESTING INTEGRATED DEVICES

FIELD OF THE INVENTION

The present invention relates to integrated devices. More particularly, the present invention relates to testing integrated devices with embedded functions.

BACKGROUND OF THE INVENTION

Testing an integrated device with an embedded function, such as memory which is built in a chip, may result in various problems as the embedded function may not be directly accessible from outside the chip. Generally, two methods have been utilized to test embedded functions such as memory in an integrated device. One method is to directly approach the control terminals of the memory from the input and output terminals of the device, and the other is to embed in the device a circuit for automatically testing the memory portion of the device. These built-in circuits are often referred to as a built-in self test (BIST) circuit.

The first approach of making the embedded memory accessible through input/output terminals may be undesirable as such terminals occupy terminals which could otherwise be used by the device for other functions. Accordingly, making an embedded memory array externally accessible may be less efficient than testing the array internal to the device. Furthermore, special test equipment may be required to test the embedded memory of the device.

In part as a result of the limitations of making embedded memory externally accessible, built-in self test circuits have been widely used to test memory within the chip. Built-in self test circuits can eliminate the need for additional input and output terminals of the device for testing memory and can be easily realized because of their simple construction. As a result, as the size of the embedded memory increases built-in self test circuits become more practical and useful.

In spite of these advantages, one disadvantage of the built-in self test circuitry is that it may malfunction and thereby indicate an otherwise acceptable device is defective. Accordingly, the built-in self test circuit should be tested before it is relied upon to other functions of the device. The methods for testing built-in self test circuits are similar to those for testing general function modules. For example, if an integrated device utilizes a scan method of testing modules the testing of the built-in self test circuit can be easily performed utilizing known scan test techniques. However, in many instances scan testing is not a viable option for testing a device. In such a case another method for testing the built-in self test circuit of an integrated device should be considered. Accordingly, because of the shortcomings of existing built-in testing techniques, there exists a need for improvements in testing of built-in self test circuitry of integrated devices.

SUMMARY OF THE INVENTION

In view of the above discussion it is an object of the present invention to provide increased reliability in the testing of integrated devices.

A further object of the present invention is to provide more complete testing of internal circuitry of an integrated device without requiring additional input/output terminals for the device.

Still another object of the present invention is to increase the level of fault detection in integrated devices with limited increase in complexity of the testing circuitry and without large increases in the time required to test an integrated device.

These and other objects are provided by the present invention which tests an integrated device having an embedded function and a built-in test circuit for testing the embedded function. The built-in test circuit provides control signals to the embedded function based upon an internal state of the built-in test circuit. The integrated device is tested by comparing the control signals provided to the embedded function to the desired control signals based upon the internal state of the built-in self test circuit to confirm the proper operation of the built-in self test circuit. This comparison may be accomplished by monitoring the internal state of the built-in test circuit and the control signals provided to the embedded function and comparing the monitored signals to an expected signal pattern based upon the monitored internal state of the built-in test circuit. An error signal may be generated if the comparison determines that the monitored signals do not correspond to the expected signal pattern.

By monitoring the internal state and control signals of the built-in test circuit and comparing those to the expected values, the present invention may effectively test the function of the built-in test circuit. Furthermore, the testing of the built-in test circuit may occur concurrently with the built-in test circuit testing the embedded function. Thus, there is no need for a separate test step for the built-in test circuit. Furthermore, because the circuitry for making the comparison may be incorporated in the integrated device the present invention may avoid adding input/output terminals to test the built-in test circuit and does not require additional external test apparatus to test the device.

In particular embodiments of the present invention, the internal state of the built-in test circuit is described by at least one counter having a plurality of bits. In such a case, monitoring the internal state of the built-in test circuit may be carried out by monitoring at least the most significant bit of at least one counter. The expected signal pattern may then include a combination of control signal values and counter bit values.

In an embodiment of the present invention where the embedded function comprises a memory array, the control signals monitored may include at least one of a write enable, a read enable and a chip select signal provided by the built-in test circuit to the memory array.

In another embodiment of the present invention, an integrated device is provided which includes an array of memory cells and a memory test circuit which generates signals to test the array of memory cells and detects errors in the array. The memory test circuit generates a memory error signal when an error is detected. A test error detecting circuit is also included and tests the operation of the memory test circuit. The test error detecting circuit generates a test error signal when an error is detected with the operation of the memory test circuit. The integrated device may also include error signal output means for outputting either or both of the memory error signal and the test error signal.

In a particular embodiment of an integrated device according to the present invention, the test error detecting circuit includes a register for receiving and storing at least one counter value of the memory test circuit and at least one of the control signals generated by the memory test circuit. The test error detecting circuit also includes a comparator for comparing a value stored in the register with a reference value and for generating the test error signal if the reference value and the value stored in the register differ.

Thus, an integrated device according to the present invention provides for testing of both an embedded function, such as memory, and testing of the memory test circuit which tests the embedded memory. Because all of these functions are implemented in a single integrated device the need for external input/output terminals for testing purposes may be reduced. Furthermore, because the test of the memory test circuit is a functional test, the test error detecting circuit may carry out its function concurrently with the memory test circuit testing the embedded memory. Thus, testing of both the embedded function and the built-in test circuit may take no more time than testing the memory alone.

In an additional embodiment of the present invention, an integrated device test circuit is provided which includes built-in test means for testing an embedded function of an integrated circuit by providing control signals to the embedded function. The integrated device test circuit also includes means for comparing the control signals provided to the embedded function to the desired control signals to confirm the proper operation of the built-in self test circuit. The integrated device test circuit may further include means for comparing the control signals to the desired control signals based upon an internal state of the built-in test means. Such means for comparing may take the form of means for monitoring the internal state of the built-in test means and means for monitoring the control signals provided to the embedded function. Means for comparing the monitored control signals to an expected signal pattern based upon the monitored internal state of the built-in test means and means for generating an error signal if the monitored signals do not correspond to the expected signal pattern would then also be included in the integrated device test circuit.

In a further aspect of the present invention where the internal state of the built-in test means is described by at least one counter having a plurality of bits, the means for monitoring the internal state may monitor at least the most significant bit of at least one counter. When the embedded function comprises a memory array, the control signals monitored by the means for monitoring the control signals may monitor one or a combination of the write enable, read enable or chip select signals provided by the built-in test means to the memory array.

The integrated device test circuit of the present invention may be incorporated in an integrated device and may function to concurrently test the embedded function of an integrated device and the built-in test circuit. Thus, the benefits of the present invention may be achieved through use of the integrated device test circuit of the present invention in that a rapid test of both embedded functions and test circuitry may be obtained without a large increase in the number of input/output terminals of the device dedicated to testing.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 1:
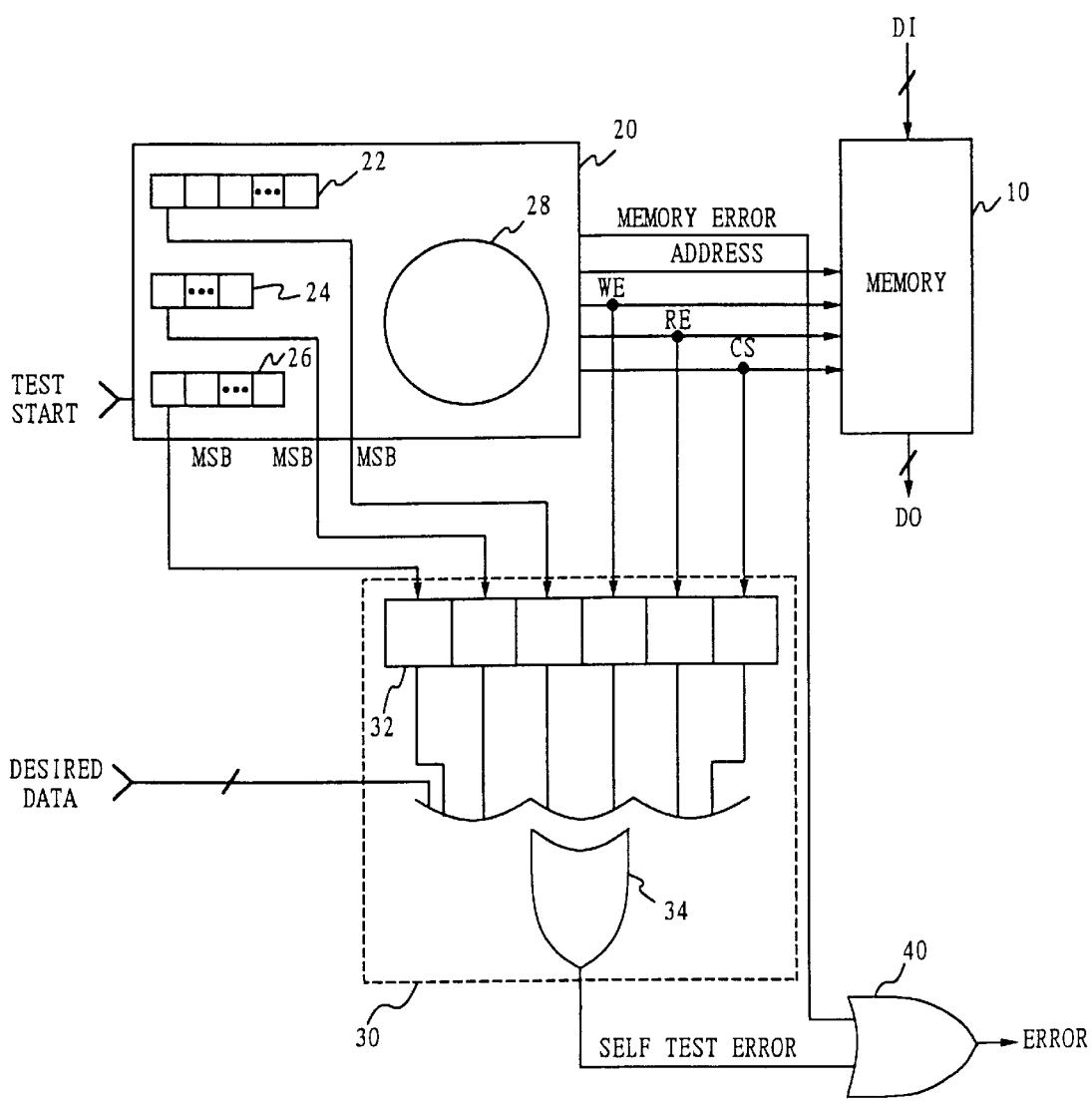
FIG. 1 is a block diagram of a test circuit in accordance with an embodiment of the present invention.

FIG. 1 illustrates a test circuit according to the present invention. The test circuit according to the present invention includes an embedded function (illustrated as the array of memory cells 10 in FIG. 1), a built-in test circuit 20, an error detect test circuit 30, and an OR gate 40.

The built-in test circuit 20 has a circuit 28 for testing the memory 10, an address counter 22 for controlling the memory 10, and counters 24 and 26 for establishing a memory test algorithm. The circuit 28 for testing the memory 10 is enabled by a test start signal. The internal state of the built-in test circuit 20 may be defined by the counters 22, 24, and 26 contained in that circuit. The built-in test circuit 20 tests the memory 10 and generates a memory error signal if the memory fails the memory test. As will be appreciated by those of skill in the art, the above described, or any, built-in test circuit for testing embedded functions, such as memory, known to those of skill in the art may be utilized to provide built-in test means which tests the embedded function by providing control signals to the embedded function. As will further be appreciated by those of skill in the art, these control signals may be provided by the built-in test means based upon an internal state of the built-in test means.

The error detect test circuit 30 for testing the built-in test circuit 20 includes a register 32 and a comparator 34. Preferably, the most significant bits of the counters 22, 24 and 26, a write enable signal WE for enabling a write operation of the memory 10, a read enable signal RE for enabling a read operation of the memory 10, and a chip select signal CS for selecting the memory 10 are stored in register 32. The comparator 34 receives the output signals of the register 32 and a corresponding expected data pattern.

The register 32 and the comparator 34, provide means for comparing the control signals generated by the built-in test circuit 20 to the desired control signals to confirm proper operation of the built-in self test circuit. The control signals by be compared based upon the internal state of the built-in test circuit 20. As illustrated in FIG. 1, the comparator 34 compares the expected data pattern which reflects the desired data to be output by the built-in test circuit 20, which is captured in register 32, with the contents of the register 32 to ascertain whether the expected data pattern and the register contents are equal. When the expected data pattern is not equal to the contents of register 32, the comparator 34 generates an error signal. When the expected data pattern is equal to the contents of register 32, the comparator 34 does not generate an error signal. The expected data pattern for use by the comparator 34 may be previously determined through simulation or may be determined in real-time.

The OR gate 40, which may act as error signal output means, generates a final error signal by ORing the output signal of the comparator 34 with the memory error signal generated by the built-in test circuit 20. Thus, if either the built-in test circuit 20 or the error detect test circuit 30 generate an error signal the output of gate 40 will indicate an error.

As illustrated in FIG. 1, the register contents include only the most significant bit of the three counters 22, 24 and 26 of the built-in test circuit 20 and the three memory control signals. However, by increasing the number of bits from the counters 22, 24, and 26 or by increasing the number of control signals stored in register 32 and compared with a corresponding expected data pattern the frequency with which errors in the built-in test circuit 20 are detected may be increased. Furthermore, the types of errors which may be detected may also be increased by including more control signals or counter bits in the data stored in register 32. As will be appreciated by those of skill in the art, while the present invention has been described with respect to three counters establishing an internal state of the built-in test circuit, any number of counters or other internal state identifying signals may be utilized to assess the functionality of the built-in test circuit.

Figure 2:
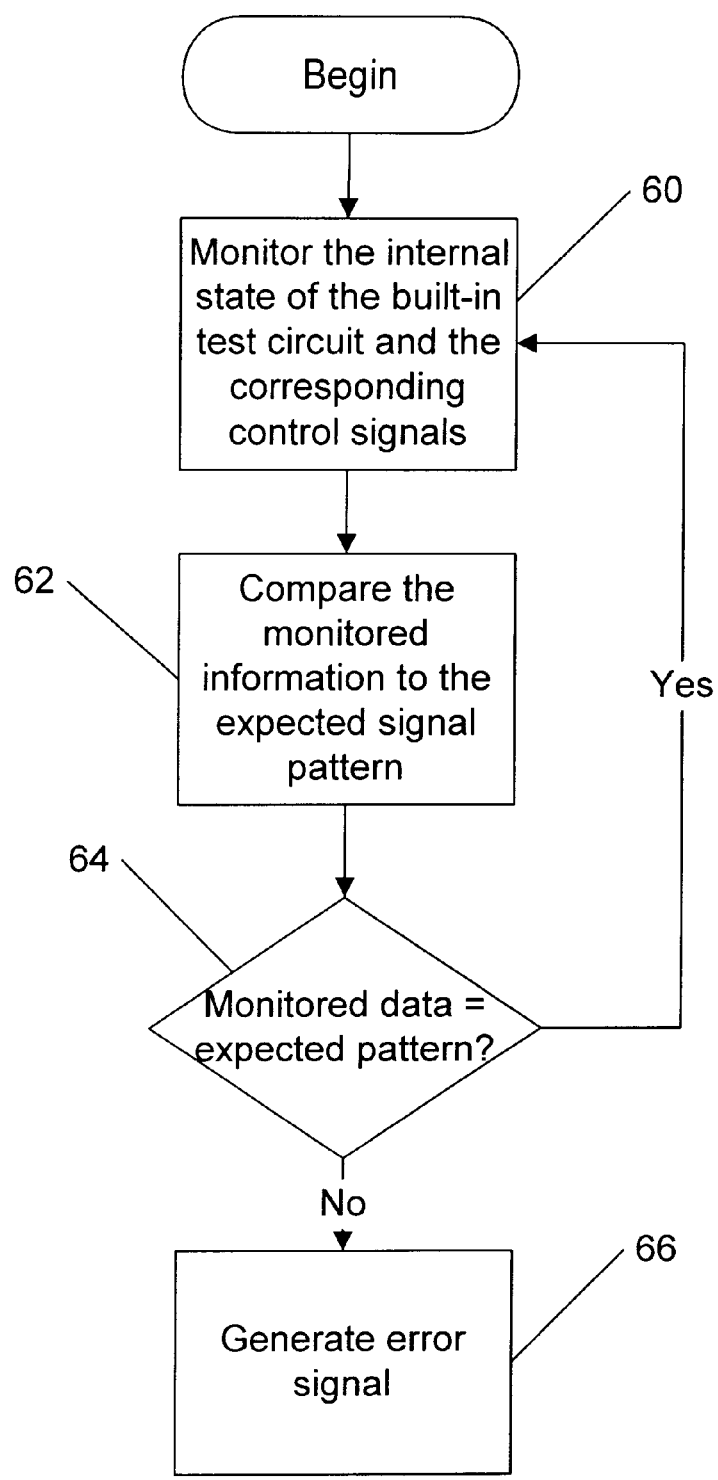
FIG. 2 is a flow chart illustrating a method of the present invention.

The operation of the present invention to test built-in test circuit 20 will now be described with reference to FIG. 1 and FIG. 2. As seen in FIG. 2, the internal state of the built-in test circuit and the corresponding control signals are monitored (block 60) and compared to the expected signal pattern (block 62). As illustrated in FIG. 1, to monitor the internal state of the built-in test circuit 20, the most significant bit MSB signals of the counters of the built-in test circuit 20 are used as test input signals for the test circuit 30. The memory control signals generated from the built-in test circuit 20 are also used as test input signals for the test circuit 30. If the monitored data is equal to the expected data then, as seen in block 64, the circuit is assumed to be functioning properly and no error signal is generated. However, if the expected data and the monitored data are not equal then it is assumed that an error has occurred and an error signal is generated, as seen in block 66, by the test error detect circuit 30.

As seen in FIG. 1, the use of the state of the MSB's of the counters as input to the error detect circuit 30 is illustrated as a preferred embodiment of the present invention. While the built-in test circuit 20 is operated, the timing of the counters 22, 24 and 26 being incremented or decremented is known, it is therefore, known when the bit values of the counters are suppose to change from "0" to "1", or from "1" to "0". The MSB's have been selected for testing the built-in test circuit 30 because the counters 22, 24 and 26 count from "0" to a maximum value and, thus, by detecting the most significant bits, it is possible to know whether or not the counters 22, 24 and 26 can achieve their maximum value. While the selection of the most significant bits of the counters has been illustrated, as will be appreciated by one of skill in the art, any number of bits of the counters may be utilized and the reliability of the testing of the function of the counters would correspondingly increase.

As will be appreciated by those of skill in this art, the preceding examples are provided, not to limit or define the scope of the present invention, but to illustrate the nature of the present invention and possible uses for the teachings of the present invention. These examples may be modified in many different ways while still obtaining the benefits of the teachings of the present invention. In the drawings, specification and examples, there have been disclosed typical preferred embodiments of the invention and, although specific terms are employed, these terms are used in a generic and descriptive sense only and not for purposes of limitation, the scope of the invention being set forth in the following claims.

That which is claimed is:

1. A method of testing an integrated device having an embedded function and a built-in test circuit for testing the embedded function by providing control signals to the embedded function based upon an internal state of the built-in test circuit, the method comprising:

comparing the control signals provided to the embedded function to the desired control signals based upon the internal state of the built-in self test circuit to confirm the proper operation of the built-in self test circuit.

2. A method according to claim 1, wherein said comparing step comprises the step of:

monitoring the internal state of the built-in test circuit;

monitoring the control signals provided to the embedded function;

comparing the monitored control signals to an expected signal pattern based upon the monitored internal state of the built-in test circuit; and generating an error signal if said comparing step determines that the monitored control signals do not correspond to the expected signal pattern.

3. A method according to claim 2, wherein the internal state of the built-in test circuit is described by at least one counter having a plurality of bits and wherein said step of monitoring the internal state comprises monitoring at least the most significant bit of the at least one counter.

4. A method according to claim 3, wherein the embedded function comprises a memory array and wherein the control signals monitored by said step of monitoring the control signals comprises monitoring at least one of a write enable, a read enable and a chip select signal provided by the built-in test circuit to the memory array.

5. A method according to claim 3, wherein the expected signal pattern comprises a combination of control signal values and counter bit values.

6. An integrated device comprising:

an array of memory cells;

a memory test circuit which generates signals to test said array of memory cells and which detects errors in said array of memory cells and generates a memory error signal when an error is detected wherein the signals generated by said memory test circuit include controls signals for controlling the operation of said array of memory cells; and a test error detecting circuit for testing the operation of said memory test circuit and for generating a test error signal when an error is detected with the operation of said memory test circuit.

7. An integrated device according to claim 6, further comprising error signal output means for outputting either of said memory error signal if said memory test circuit generates said memory error signal and said test error signal if said test error detecting circuit generates said test error signal.

8. An integrated device according to claim 6, wherein said test error detecting circuit comprises:

a register for receiving and storing at least one counter value of said memory test circuit and at least one of said control signals generated by said memory test circuit; and a comparator for comparing a value stored in said register with a reference value and for generating said test error signal if said reference value and said value stored in said register differ.

9. An integrated device according to claim 8, wherein said counter value stored by said register comprises the most significant bit of at least one counter of said memory test circuit.

10. An integrated device test circuit comprising:

built-in test means for testing an embedded function of said integrated circuit by providing control signals to the embedded function; and means for comparing the control signals provided to the embedded function to the desired control signals to confirm the proper operation of said built-in test means.

11. An integrated device test circuit according to claim 10, wherein said built-in test means provides said control signals based upon an internal state of said built-in test means; and wherein said means for comparing the control signals compares the control signals to the desired control signals based upon the internal state of said built-in test means.

12. An integrated device test circuit according to claim 11, wherein said means for comparing comprises:

means for monitoring the internal state of said built-in test means;

means for monitoring the control signals provided to the embedded function;

means for comparing the monitored control signals to an expected signal pattern based upon the monitored internal state of said built-in test means; and means for generating an error signal if said means for comparing determines that the monitored signals do not correspond to the expected signal pattern.

13. An integrated device test circuit according to claim 12, wherein the internal state of said built-in test means is described by at least one counter having a plurality of bits and wherein said means for monitoring the internal state comprises means for monitoring at least the most significant bit of the at least one counter.

14. An integrated device test circuit according to claim 13, wherein the embedded function comprises a memory array and wherein the control signals monitored by said means for monitoring the control signals comprises means for monitoring at least one of a write enable, a read enable and a chip select signal provided by the built-in test means to the memory array.

15. A method according to claim 13, wherein the expected signal pattern comprises a combination of control signal values and counter bit values.

* * * * *